(12) United States Patent
Matsui et al.

(10) Patent No.: US 6,576,554 B2
(45) Date of Patent: Jun. 10, 2003

(54) SLURRY FOR CMP, METHOD OF FORMING THEREOF AND METHOD OF MANUFACTURING SEMICONDUCTOR DEVICE INCLUDING A CMP PROCESS

(75) Inventors: Yukiteru Matsui, Yokohama (JP); Gaku Minamihaba, Kawasaki (JP); Hiroyuki Yano, Yokohama (JP); Dai Fukushima, Fujisawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/903,533

(22) Filed: Jul. 13, 2001

(65) Prior Publication Data

US 2002/0006728 A1 Jan. 17, 2002

(30) Foreign Application Priority Data

Jul. 14, 2000 (JP) ......................................... 2000-214510

(51) Int. Cl.$^7$ ........................ H01L 21/302; H01L 21/461
(52) U.S. Cl. ...................................... 438/693; 252/79.2
(58) Field of Search ................................ 438/692, 693, 438/959; 252/79.2; 216/52

(56) References Cited

U.S. PATENT DOCUMENTS

| 5,607,718 A | 3/1997 | Sasaki et al. |
| 5,775,980 A | 7/1998 | Sasaki et al. |

*Primary Examiner*—Olik Chaudhuri
*Assistant Examiner*—Fernando Toledo
(74) *Attorney, Agent, or Firm*—Oblon, Spivak, McClelland, Maier & Neustadt, P.C.

(57) ABSTRACT

A slurry for CMP having a liquid and a plurality of polishing particles, wherein the polishing particle contains an organic particle and a plurality of inorganic particles, and the organic particle and the inorganic particles are unified by thermo-compression bonding.

6 Claims, 4 Drawing Sheets

SLURRY FOR CMP, METHOD OF FORMING THEREOF AND METHOD OF MANUFACTURING SEMICONDUCTOR DEVICE INCLUDING A CMP PROCESS

CROSS-REFERENCE TO RELATED APPLICATIONS

This application is based upon and claims the benefit of priority from the prior Japanese Patent Application No. 2000-214510, filed Jul. 14, 2000, the entire contents of both of which are incorporated herein by reference.

BACKGROUND OF THE INVENTION

1. Field of the Invention

The present invention is related to slurry for CMP used in the field of semiconductor device manufacturing, a method of forming the slurry and a method of manufacturing semiconductor device including a CMP process.

2. Description of the Related Art

Recently, in the field of semiconductor device manufacturing, various microfabrication technologies have been developed as integration of semiconductor device increases and size of semiconductor element decreases. Among the microfabrication technologies, CMP technology has become an essential technology for a formation of damascene wiring.

When forming the damascene wiring with metal CMP, the most important subject is to prevent an occurrence of erosion and avoid causing scratch. For preventing such erosion, it is required to use a hard polishing cloth and a slurry for CMP, (hereinafter simply referred to as "slurry") having the margin for over polishing.

For expanding the margin against the over polishing, it is a key factor to efficiently transfer a change in loading to a metal film as a substrate to be polished. CMP property giving high dependence of the loading on the polishing rate, i.e., the polishing rate sensitively responds to the change in the loading, is desired.

As a method to realize such CMP property, it is effective to use a slurry containing an organic particle and a plurality of inorganic particles in an unified state as polishing particles. This method is to cohere inorganic particles around an organic particle having no polishing performance to use the organic particle as an assist particle for the inorganic particles.

By using such slurry described above, the change in the loading is efficiently transferred to the substrate to be polished by the elasticity of the organic particle, thereby increasing the dependency of the polishing rate on the loading, and also, the elasticity can avoid the scratching which is caused by using a hard polishing cloth.

BRIEF SUMMARY OF THE INVENTION

It is an object of the present invention to provide a slurry effective to realize CMP having property of low erosion and high margin against over polishing, a method of forming the slurry and a method of manufacturing a semiconductor device having CMP process capable of realizing CMP with low erosion and high margin against over polishing.

In order to achieve the object of the present invention described above, the first aspect of the present invention includes a slurry for CMP comprising: a liquid; and a plurality of polishing particles contained in the liquid, the polishing particle comprising at least one organic particle and at least one inorganic particle, and the organic particle and the inorganic particles being formed unified by thermocompression bonding.

The second aspect of the present invention includes a method of forming a slurry for CMP comprising: mixing a plurality of organic particles with a plurality of inorganic particles in powder state and with use of mechanofusion phenomenon, unifying at least one of the plurality of organic particles and at least one of the plurality of inorganic particles, to forme a plurality of polishing particles; and adding the polishing particles into a liquid.

The third aspect of the present invention includes a method of manufacturing a semiconductor device comprising: forming a conductive film above a substrate; and polishing the conductive film by using a slurry for CMP, the slurry including a plurality of polishing particles, the polishing particle comprising at least one organic particle and at least one inorganic particle, and the organic particle and the inorganic particles being unified by thermocompression bonding.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

DETAILED DESCRIPTION OF THE INVENTION

Now, the present invention is further explained with referring to the accompanied drawings.

(First Embodiment)

In this embodiment, a slurry for W-CMP used at a formation of W damascene wiring is explained. Each of the polishing particles in the slurry for W-CMP of the present embodiment is an aggregate composed of a PMMA particle as an organic particle and a plurality of manganese dioxide particles as inorganic particles, the PMMA particle and manganese dioxide particles are unified by thermocompression bonding, which is obtained by mixing the PMMA particle with manganese dioxide particles in powder state (powder mixing) and using mechanofusion phenomenon.

Figure 9:
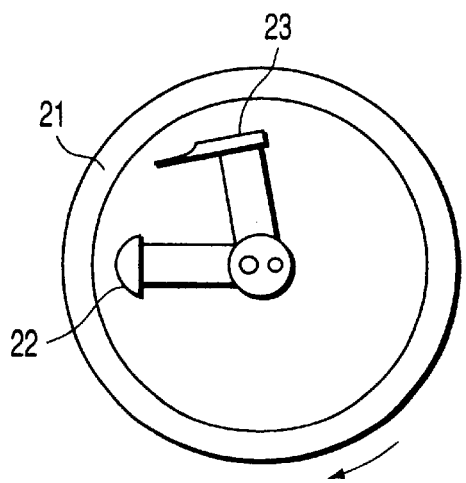
FIG. 9 is a schematic illustration showing the manufacturing device using mechanofusion phenomenon for forming polishing particles.

Now, a process for forming the polishing particles by using mechanofusion phenomenon is specifically explained in the following (See FIG. 9). Firstly, the both types of powder are fixed on the interior surface of a rotating container 21 by the centrifugal force, accordingly the two types of the powder are transiently cohered on the surface by pressure of an inner piece 22 which is fixed at the central shaft. Then, these powder applied with pressure are taken off by a scraper 23. By repeating the processes described above at a high rate, cohesion with pressure and shearing stress are applied to the particles to complete the complex process of the particles, thereby an aggregate composed of the both types of the particles by thermocompression bonding using mechanofusion phenomenon is obtained. In this embodiment, the aggregate obtained in such a way described above is used as the polishing particles. The polishing particles are then added into the pure water, thereby to obtain the slurry for W-CMP use.

Incidentally, the particles of PMMA and manganese dioxide which have failed form the aggregate are removed by filtering. The particle diameter of the aggregate is larger than that of each particle of PMMA and manganese dioxide. Therefore, by using a filter, the mesh size of which is smaller than the particle diameter of the aggregate, the PMMA and manganese dioxide can be easily removed.

The interparticle attracting force of the slurry for W-CPM obtained by powder mixing (the slurry of the embodiment of the present invention) becomes stronger than that of a slurry for W-CMP obtained by liquid mixing (the slurry in the comparative example). As a result, the slurry of the embodiment of the present invention has better CMP property in the polishing rate, the slurry stability, the slurry supply property, and the like, than those of the slurry provided in the comparative example.

Figure 1:
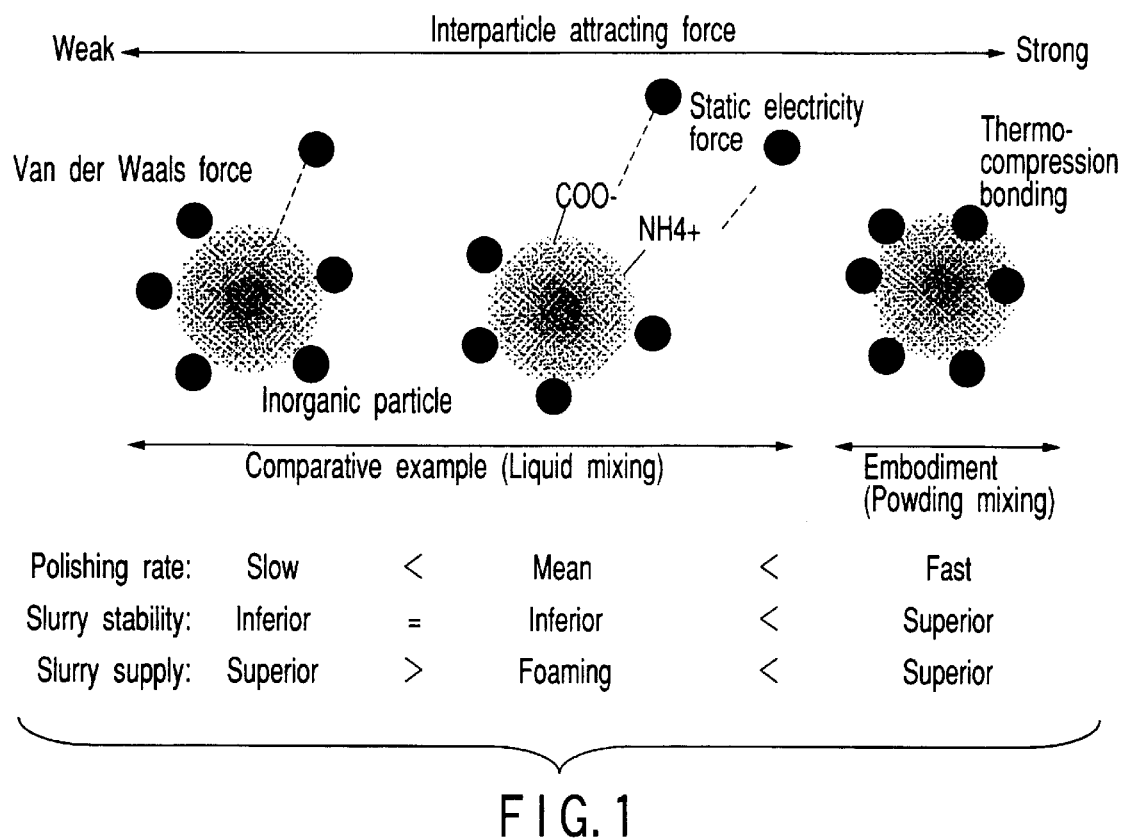
FIG. 1 is a schematic view showing the slurry according to an embodiment of the present invention and the conventional slurry, and a comparison of both slurries in their polishing rate, slurry stability and slurry supply property.

The slurry for CMP obtained by the liquid mixing comprises a type of aggregate of an organic particle and inorganic particles obtained by mixing a type of slurry containing organic particles with another type of slurry containing inorganic particles, and then unifying these particles with use of van der Waals force or static electricity force. However, the aggregate obtained according to the process described above has an insufficient interparticle attracting force, so when a slurry containing the aggregate is used, a high polishing rate and high dependency on loading is not obtained as has been expected. In FIG. 1, the CMP property is comparatively shown for the slurry of the embodiment of the present invention and the slurry of the comparative example.

The primary particle diameters of the inorganic and organic particles are preferably within the range of 5 to 1,000 nm. The term "primary particle diameters" is intended to refer to the diameters of the particles in the dispersed state, and does not indicate the diameters of the particles in the aggregated state, such as the state shown in FIG. 1. The reason for setting the upper limit of the primary particle diameters to be 1,000 nm is that particles having diameters larger than this limit cannot be dispersed in a satisfactory manner. The reason for setting the lower limit to be 5 nm is that particles having diameters smaller than this limit are so intensive in Brownian movement that they attach to one another very easily. Since the settling velocity of the adsorbed particles is high, it is hard to ensure a required polishing rate.

The concentration of the inorganic particles in the slurry is preferably within the range of 0.5 to 3 percent by weight, and the concentration of the organic particles in the slurry is preferably within the range of 0.1 to 2 percent by weight. One of the reasons for setting the upper concentration limits of the inorganic and organic particles to be 3 and 2 percent by weight, respectively, is that concentrations higher than these limits tend to deteriorate the dispersion characteristic of particles. If the dispersion characteristic of particles is deteriorated, the particles easily attach to one another, forming larger aggregates. Since such large aggregates are precipitated, the number of particles actually used for polishing decreases, accordingly. As a result, a desirable polishing rate is hard to ensure. Another reason for setting the upper concentration limits as above is that concentrations higher than these limits tend to increase the polishing rate of insulating films, such as an $SiO_2$ film. If the insulating films are polished fast, selective removal of metallic films become hard. The reason for setting the lower concentration limits of the inorganic and organic particles to be 0.5 and 0.1 percent by weight, respectively, is that concentrations lower than these limits do not ensure a required polishing rate.

Figure 2A:
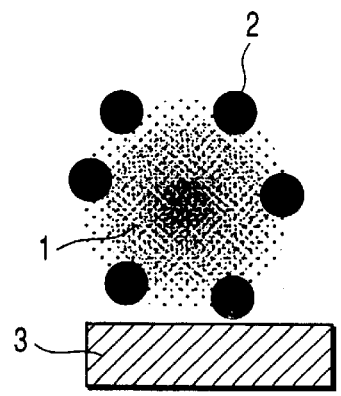
FIGS. 2A and 2B are schematic views showing dependency on the loading when using the slurry according to the first embodiment of the present invention.

Regarding the loading dependency, the aggregate of PMMA 1 and manganese dioxide 2 is not deformed when light loading is applied as shown in FIG. 2A, and the manganese dioxide hardly works on W film 3. Since the W film 3 is so a hard film, if not oxidized, no polishing of the W film proceeds unless the oxidation occurs.

Figure 2B:
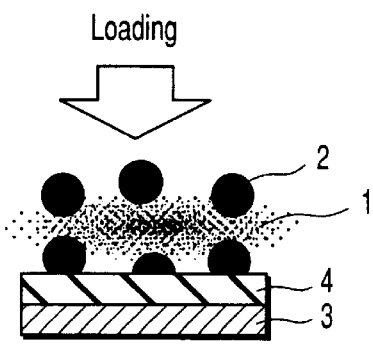

On the other hand, in case of heavy loading is applied, PMMA 1 causes the elastic deformation as shown in FIG. 2B, a great amount of manganese dioxide works on a W film 3 to increase the interaction between the manganese dioxide and the W film 3. At this time, an extremely fragile oxidized film 4 ($WO_x$ film) is formed on the surface of the W film 3 resulting from the oxidizing action of the manganese dioxide 2 and the oxidized film 4 is removed due to the effect of manganese dioxide 2 which is also considered as polishing particles. As a result, polishing of the W film 3 proceeds at sufficiently high rate.

The interparticle attracting force of the slurry for W-CMP according to this embodiment is greater since PMMA particle and manganese dioxide particles are strongly cohered in a manner of thermocompression bonding. CMP for which the slurry for W-CMP of this embodiment is used can convey the loading to the W film more efficiently comparing to CMP for which the slurry for W-CMP having less interparticle attracting force obtained by liquid mixing in the comparative example.

Figure 3:
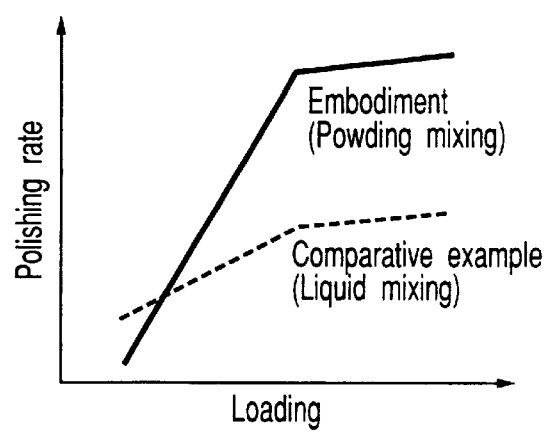
FIG. 3 is a graph showing the dependency on the loading when using the slurry of the first embodiment of the present invention and the conventional slurry respectively.
Figure 4:
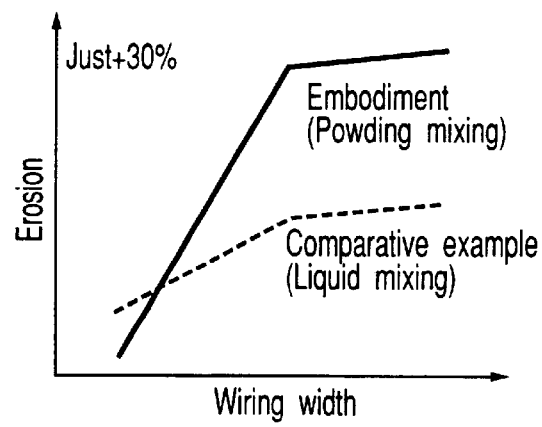
FIG. 4 is a graph showing the dependency of the erosion on wiring width when using the slurry of the first embodiment of the present invention and the conventional slurry.

As a result, as shown in FIG. 3, polishing rate in this embodiment is faster than that of the comparative example since the oxidizing effect (chemical effect) of the manganese dioxide efficiently work on the W film when heavy loading is applied, which can effectuate CMP with greater loading dependency than that of the comparative example. Therefore, as shown in FIG. 4, this embodiment realize suppressing the occurrence of the erosion (depth of the wiring groove before CMP process performed—thickness of the wiring in the wiring groove after CMP process performed) to greater extent at the over polishing irrespective of the degree in the width of the wiring comparing to the case of the comparative example. Namely, it is possible to expand the margin against the over polishing for the erosion.

Further, according to the method for forming the CMP slurry of this embodiment, there is no limitation in pH as required for the liquid mixing since the organic particles and the inorganic particles are combined in powder state, and arbitrary combination of the organic particles and the inorganic particles is allowed.

In case of the liquid mixing, particularly the liquid mixing with use of the static electricity force, is employed, it is required to introduce the electrified functional group, for example $COO^-$, on the surface of the organic particles in order to hold electric charges on the surface of the organic particles. For cohering the organic particle and the inorganic particles, the electric charge on the surface of each particle must be contrary with each other. Therefore, available particle and the pH range of the slurry is limited.

Further, in case of the powder mixing, contrarily to the liquid mixing, instability of each slurry per se does not greatly affect on the property of the slurry in which the organic particle and the inorganic particles have been unified. Consequently, according to this embodiment, slurry controlling property is improved, thereby allowing to obtain stable CMP property.

In addition, in case of the powder mixing, it is not required to introduce a functional group on the surface of the organic particle contrary to the case of the liquid mixing with use of the static electric force. The organic particle which has introduced the functional group on its surface becomes a surface active particle having a hydrophobic part and a hydrophilic part, which causes an active foaming of the slurry. In such a case, the supply of the slurry become difficult. Therefore, according to the present embodiment, such foaming of the slurry is prevented and stable supply of the slurry is realized.

Though manganese dioxide is used as the inorganic particles having oxidizing effect in this embodiment, the similar effect is also obtained by using the other inorganic particles having oxidizing effect, such as ceria.

(Second Embodiment)

In this embodiment, a slurry for W-CMP used at forming W damascene wiring is explained. Each of the polishing particles in the slurry for W-CMP of this embodiment is an aggregate composed of single particle of PMMA and a plurality of red iron oxide particles, which is obtained by combining a PMMA particle as an organic particle and iron oxide red particles as inorganic particles in powder state (powder mixing) and then thermocompression bonding the both particles by mechanofusion phenomenon. The slurry for W-CMP of this embodiment contains hydrogen peroxide as an oxidizing agent.

Figure 5A:
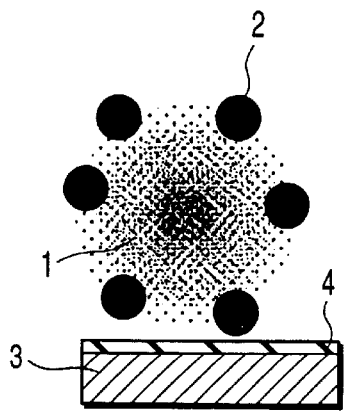
FIGS. 5A and 5B are schematic views for explaining the dependency on the loading when using the slurry according to the second embodiment of the present invention.

When light loading is applied, likely to the reason described in the first embodiment, the red iron oxide 2 hardly works on the W film 3, as shown in FIG. 5A. Therefore the polishing rate of the W film 3 becomes very slow even though a fragile oxidized film 4 ($WO_x$ film) is formed by the hydrogen peroxide on the surface of the W film 3.

Figure 5B:
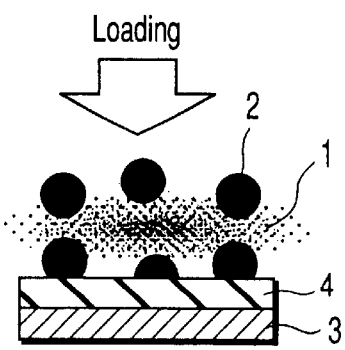

On the other hand, when heavy loading is applied, likely to the reason described in the first embodiment, the interaction between the red iron oxide 5 and the W film 3 becomes greater as shown in FIG. 5B, and further, the oxidation force of the hydrogen peroxide remarkably increases by the catalysis($Fe \rightarrow H_2O_2$) by the iron ions in the red iron oxide 5. As a result, chemical effect of the red iron oxide 5, namely the chemical polishing by the red iron oxide 5, is enhanced, thereby a very high rate polishing process of the W film 3 is realized.

As described above, by using red iron oxide having the catalysis as the inorganic particles, the loading dependency can be improved and the margin against the over polishing can be expanded more easily than those in the first embodiment. Also, other similar effects as those obtained in the first embodiment are obtained in this embodiment.

Besides, the red iron oxide containing iron as a component is used in this embodiment as the inorganic particles having the catalysis to facilitate decomposition of the oxidizing agent, however, other inorganic particles containing iron as a component or other inorganic particles containing silver, ruthenium or titanium can be used to obtain the similar effect.

(Third Embodiment)

FIGS. 6A–6D are sectional views showing a manufacturing process of a Al damascene wiring according to the third embodiment of the present invention. The Al damascene wiring is used for DRAM and high performance logic LSI, for example.

Figure 6A:
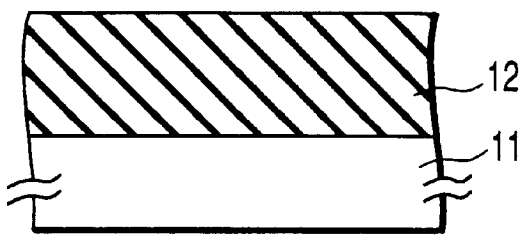
FIGS. 6A through 6D are sectional views showing a manufacturing process of a Al damascene wiring according to the third embodiment of the present invention.

As shown in FIG. 6A, a $SiO_2$ containing interlayer insulating film 12 is deposited on a silicon substrate 11 at first. On the silicon substrate 11, a plurality of elements (not shown in the figure) for DRAM and high performance logic LSI are formed in integrated manner. As the silicon substrate 11, either a bulk substrate or a SOI substrate can be used.

Figure 6B:
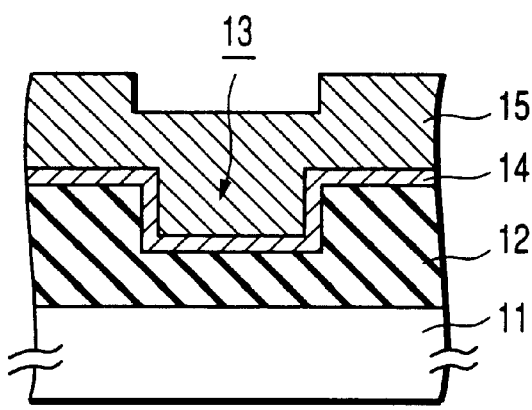

As shown in FIG. 6B, a wiring groove 13 with the depth of 400 nm is formed on the surface of the interlayer insulating film 12, then Nb liner film 14 with the thickness of 15 nm is deposited on the insulation film, and Cu containing Al film 15 (Al—Cu film) with the thickness of 800 nm is subsequently deposited on the Nb liner film 14. The Nb liner film 14 and the Al film 15 is formed by sputtering method, for example.

Figure 6C:
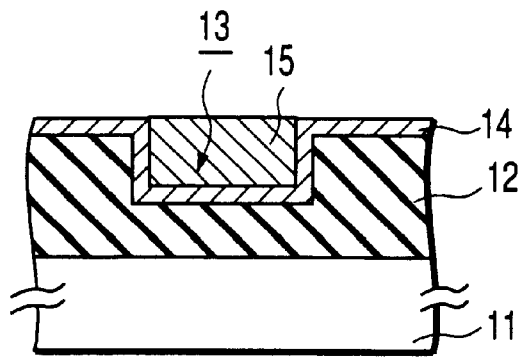
Figure 6D:
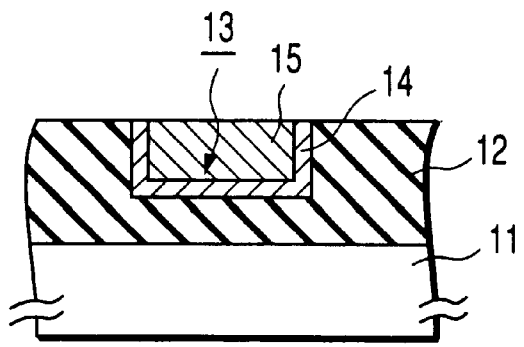

Then, as shown in FIG. 6C, the excessive Al film 15 being out of the wiring groove 13 are removed by the CMP process using the slurry for Al-CMP use of the present embodiment(First polishing).

Each of the polishing particles in the slurry for Al-CMP of the present embodiment is an aggregate with three layered structure (trilayered aggregate), which is obtained by combining PMMA particles as the organic particles and alumina particles as the inorganic particles in powder state, thermocompression bonding the both types of particles by mechanofusion phenomenon to form aggregates with two layered (bilayered aggregates), and then thermocompression bonding the bilayered aggregate and PMMA particles by mechanofusion phenomenon. Then, the trilayered aggregates are added into an ordinary type of slurry and then dispersed to thereby obtain the slurry for Al-CMP of the present embodiment.

Figure 7A:
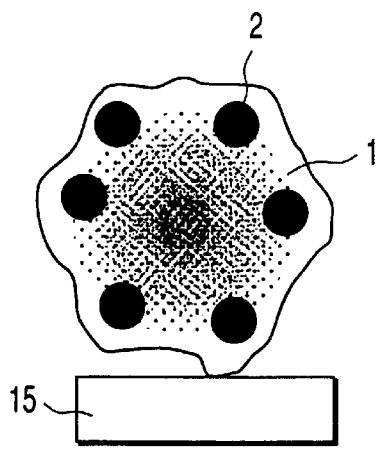
FIGS. 7A and 7B are schematic illustrations for explaining the dependency on the loading when using the slurry according to the third embodiment of the invention.

When light loading is applied, the polishing of the Al film 15 hardly proceed since the most outer surface of the trilayered structural aggregate is PMMA having no polishing performance, as shown in FIG. 7A.

Figure 7B:
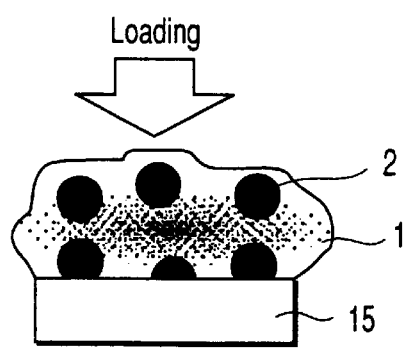

On the other hand, when heavy loading is applied, the PMMA described above is crushed, whereby most of the alumina in the bilayered aggregate work on the Al film 15 as shown in FIG. 7B. Namely, the polishing of the Al film 15 is remarkably proceeded owing to the mechanical polishing effect brought by the alumina. As a result, a very high rate polishing process of the Al film 15 is achieved.

Therefore, by using the aggregate (PMMA/Alumina/PMMA) with three layered structure as the polishing particle, the loading dependency can be further improved and the margin against the over polishing can be expanded more easily than the case using the aggregate with tree layered structure. Also, other similar effects as those obtained in the first embodiment are obtained in this embodiment.

Then, excessive Nb liner film 14 being out of the wiring groove 13 and unusable Al film 15 remained at the first polishing are removed by a conventional CMP process (Second polishing).

The polishing particles are made of colloidal silica, for example. PMMA/alumina/PMMA aggregates are particles effective in polishing Al. If they are used in the second polishing, the Al film 15 formed in the wiring groove 13 can be polished excessively. Hence, the PMMA/alumina/PMMA aggregates are not employed in the second polishing.

(Fourth Embodiment)

In this embodiment, a process for forming Al damascene wiring is explained. The point that this embodiment differs from the third embodiment is directed to the slurry to be used at the first polishing. Namely, in all embodiments described above, the major particle (nucleus particle) is an organic particle, however, an inorganic particle, for example silica, is used as the major particle (nucleus particle) and an organic particle, for example PMMA, is used as the miner particle in this embodiment. The slurry of the present embodiment can be obtained by the similar process using mechanofusion phenomenon described in the previous embodiments.

Figure 8A:
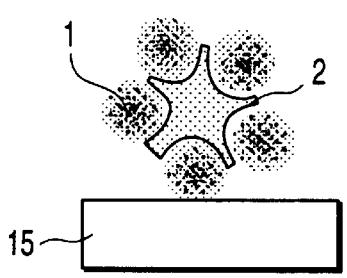
FIGS. 8A and 8B are schematic illustrations for respectively explaining the dependency on the loading when using the slurry according to the fourth embodiment of the invention.

When light loading is applied, as shown in FIG. 8A, the organic particle 1 locating on the most outer surface of the aggregate does not contact with the Al film 15 and the polishing of the Al film 15 hardly proceed since PMMA used as the organic particle has no polishing effect.

Figure 8B:
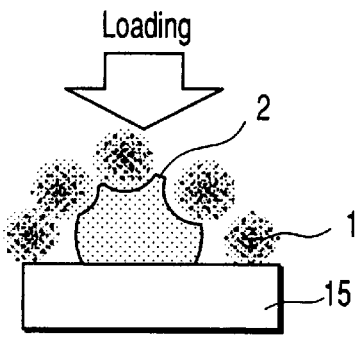

While, when heavy loading is applied, as shown in FIG. 8B, the PMMA is crushed, then the silica used as the inorganic particle 2 with greater polishing ability against the Al film appears and directly contacts with the Al film 15, so that the polishing of the Al film 15 owing to the polishing effect brought by the silica dominates remarkably, thereby a very high rate polishing process of the Al film is performed.

Thus, by using the aggregate of which major particle (nucleus particle) is an inorganic particle and the miner particles are organic particles, the loading dependency can be further improved easily, and the margin against the over polishing can be further expanded easily. Also, other similar effects as those obtained in the first example are obtained in this embodiment.

The present invention is explained in detail with referring to the embodiments 1–4, it should be noted that the scope of the present invention is not limited to the description in those examples. For instance, the first embodiment and the second embodiment can be combined. Namely, metal CMP can be performed by using a slurry containing polishing particles and oxidizing agent, each of the polishing particles is obtained by thermocompression bonding inorganic particles having oxidizing action, inorganic particles capable of promoting the decomposition of an oxidizing agent and an organic particle.

In the embodiments described above, PMMA particles being one of methacrylate resins are used as the organic particles, other type of particles composed of other type of methacrylate resin can be used, and furthermore, any type of particles composed of a phenol resin, an urea resin, a melamine resin, a polystyrene resin, a polyacetal resin or a polycarbonate resin, which has substantially the same hardness as that of said methacrylate resin, can be applicable.

Further, in the embodiments described above, hydrogen peroxide is used as the oxidizing agent. Other types of oxidizing agents, such as ammonium peroxodisulfate (ammonium persulfate), phosphoric acid, and nitric acid, are also adoptable in place of the hydrogen peroxide.

Still further, the CMP for W film, Al film or Nb film is described in the embodiments above, while any film capable of functioning as a film to be polished can be used, and other than the films given in the embodiments described above, a monolayer or laminated metal film composed of a material selected from a group consisting of Cu, Al, W, Ti, Mo, Nb, Ta, Ag, V, Ru, Pt, an alloy whose main component composed of at least one material selected from the group, a nitride includes at least one material selected from the group, a boride includes at least one material selected from the group, an oxide includes at least one material selected from the group, and a mixture includes at least one material selected from the group.

Still further, so called single damascene wiring was described in the embodiments described above, the present invention is also applicable for dual damascene wiring. Moreover, the present invention is applicable for CMP process other than the field of wiring, for example, CMP process of metal gate electrodes used for damascene gate type transistors.

Still further, the polishing particles including an organic particle and a plurality of inorganic particles, and the organic particle and the inorganic particles are unified by thermocompression bonding is used in the embodiments described above, other types of the polishing particles, i.e. the polishing particles including an organic particle and an inorganic particle, a plurality of organic particle and an inorganic particle, or a plurality of organic particles and a plurality of inorganic particles can be used.

Still further, the polishing particles including a kind organic particle and a kind of inorganic particles, and the organic particle and the inorganic particles are unified by thermocompression bonding is used in the embodiments described above, other types of the polishing particles, i.e. the polishing particles including a kind of organic particle and a plurality of kinds of inorganic particles, a plurality of kinds of organic particle and a kind of inorganic particle, or a plurality of kinds of organic particles and a plurality of kinds of inorganic particles can be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:

forming a conductive film above a substrate; and polishing the conductive film by using a slurry for CMP, the slurry including a plurality of polishing particles, the polishing particle comprising at least one organic particle and at least one inorganic particle, and the organic particle and the inorganic particles being unified by thermocompression bonding.

2. The method of manufacturing a semiconductor device according to claim 1, wherein the substrate includes a semiconductor substrate and an insulating film with a wiring groove on its surface formed above the semiconductor substrate, and the conductive film is formed on the insulating film so as to embed the wiring groove, followed by polishing the conductive film so as to remove the conductive film out of the wiring groove.

3. The method of manufacturing a semiconductor device according to claim 2, wherein the conductive film comprises at least one of metal selected from a group consisting of Cu, Al, W, Ti, Mo, Nb, Ta, Ag, V, Ru, and Pt, an alloy including at least one metal selected from the group, a nitride including at least one metal selected from the group, a boride including at least one metal selected from the group, an oxide including at least one material selected from the group, and a mixture including at least one metal selected from the group.

4. The method of manufacturing a semiconductor device according to claim 1, wherein the polishing particle comprises a organic particle and a plurality of inorganic particles.

5. The method of manufacturing a semiconductor device according to claim 1, wherein the inorganic particle has oxidizing action.

6. The method of manufacturing a semiconductor device according to claim 5, wherein the inorganic particle contains at least one of manganese dioxide and ceria.

\* \* \* \* \*